June 19, 1962 C. E. GRANZOW 3,040,119

ELECTRIC CIRCUIT BOARD

Filed Dec. 27, 1960

INVENTOR
CLARENCE EDWARD GRANZOW
BY Talbert Dick & Darley
ATTORNEYS

WITNESS
NORMAN G. TRAVISS

United States Patent Office 3,040,119
Patented June 19, 1962

3,040,119
ELECTRIC CIRCUIT BOARD
Clarence Edward Granzow, 3935 N. 45th Place, Phoenix, Ariz.
Filed Dec. 27, 1960, Ser. No. 78,539
4 Claims. (Cl. 174—68.5)

This invention relates to circuit boards and the method of producing the same and more particularly to circuit boards having wire receiving holes through them.

Some circuit boards are of the laminated type in that they have a center insulation base sheet and a fixed copper sheet on both sides of the base sheet. Extending through the laminated sheet are a plurality of holes for receiving electrical leads. Usually these lead wires or prongs are electrically connected to the circuit board by soldering. Obviously, much difficulty is experienced not only in obtaining a good and long lasting electrical connection, but even if one of the sheets of copper is successfully contacted, there is no asssurance that the other copper sheet is successfully electrically contacted. Furthermore, if the lead wire is the connecting means between the two copper sheets, solder would have to be used on both sides of the board. However, even if the soldering is successful, the circuit is subject to breakage. Obviously, the best method of electrically connecting the two copper sheets would be the direct bonding of the two copper sheets by copper instead of by solder. Still another type of circuit board is the single plastic sheet with the circuit embossed on both sides of the sheet. Such circuit boards also have conductive through holes and may have conductive through fills.

Therefore, one of the principal objects of my invention is the successful electrical connecting of a circuit on one side of a circuit board without the circuit on the other side of the circuit board.

More specifically, the object of this invention is to electrically connect the two or more circuits of a circuit board of a hole-through circuit board, by mechanically pressing into the hole a quantity of copper or like metal particles.

A further object of this invention is to provide a hole-through circuit board that not only has compressed metallic particles in the hole for electrically connecting the two sides of the board but permits the extending of a lead wire or like into the hole.

A still further object of this invention is to provide a circuit board that is strong and substantially indestructible under hard usage.

A still further object of my invention is to provide a circuit board that insures the successful electrical connecting of lead wires or like.

Still further objects of my invention are to provide a circuit board that is economical in manufacture, durable in use, and refined in appearance.

These and other objects will be apparent to those skilled in the art.

My invention consists in the construction, arrangements, and combination, of the various parts of the device, whereby the objects contemplated are attained as hereinafter more fully set forth, specifically pointed out in my claims, and illustrated in the accompanying drawings, in which:

Figure 3:
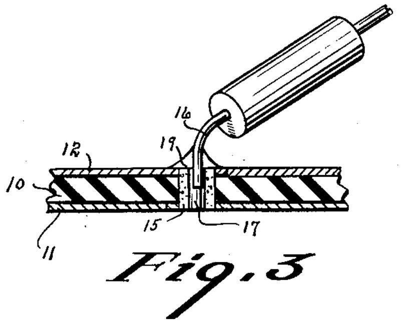
FIG. 3 is a side sectional view of a laminated type of board showing the lead wire extending into a conductive hole that extends completely through the board.

In FIG. 3 I have have used the numeral 10 to designate the non-conductive base insulation sheet of this type of a circuit board. The numerals 11 and 12 designate the two outer copper sheets of the laminated circuit board attached to the two outer sides, respectively, of the base sheet 10. In all hole-through circuit boards there are a plurality of holes 13 extending completely through the width of the circuit board.

It is to such a circuit board that my invention may be applied and which I will now describe in detail. As herebefore indicated, I compress under pressure into each hole of the board, powdered or granular grains or particles of an electro-conductive metal. Preferably I use particles of copper due to the high conductivity of copper. Any suitable mechanism may be employed to tightly compress the metallic particles in the holes 13, and when so compressed under pressure they will be solidified into a rigid mass 15 and permanently anchored in the holes 13. The two ends of the compressed solidified material of each hole will bond onto and electrically engage the two copper sheets, respectively, of the circuit board. If desired, the particles of metal may be compressed in the holes at the time the holes are punched in the board, thereby making for economy of manufacture. If the holes 13 are to be also used for the reception of electrical lead wires or prongs 16 the compressed solidified particles in the holes 13 should be in the form of a sleeve or cylinder 17 and as shown in FIG. 3 This structure is easily accomplished at time of manufacture by using a removable pin that extends through the center of the hole at the time the particles are compressed in the hole around it.

When a lead 16 is secured by solder 19 to either the sheet 11 or sheet 12, or to the cylinder 17, it will also be electrically connected to the other. Even if the solder were to break, the chances are that the lead would electrically contact at some point the inside of the cylinder 17. When the lead 16 is soldered at one side of the board, it is not necessary to solder it at the other side of the board inasmuch as the other side of the board is already electrically connected to the first side of the board. Also by the copper compressed particles extending completely through the hole 13, solder may be run down into the now copper lined hole thereby making the solder connection almost unbreakable.

Figure 1:
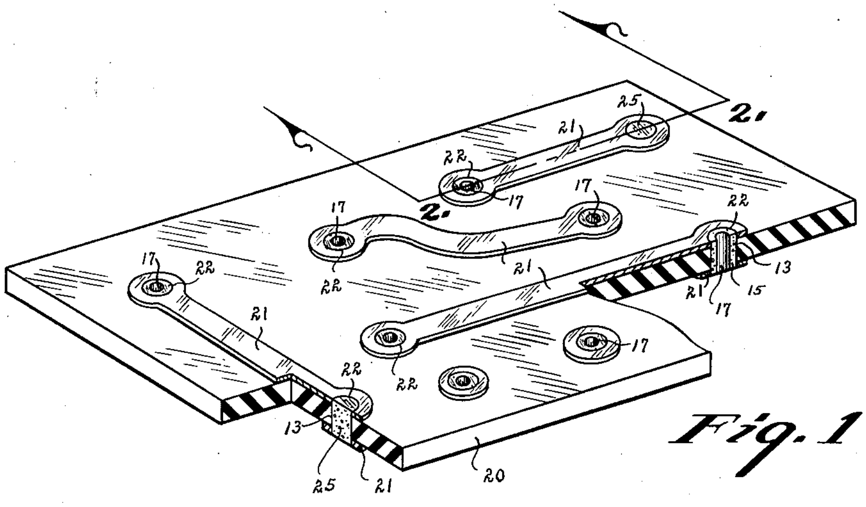
FIG. 1 is a perspective view of my circuit board with sections cut away to more fully illustrate its construction.
Figure 2:
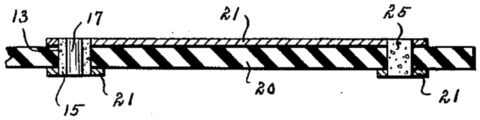
FIG. 2 is a sectional view of the circuit board taken on line 2—2 of FIG. 1.

Perhaps the most popular circuit board would be of the single sheet type as shown in FIG. 1 and FIG. 2. The single non-conductive base sheet is designated by the numeral 20 and also has the through holes 13. At each side of the board sheet 20 are the usual printed or embossed circuits 21. These electro-conductive circuits have holes 22 communicating with at least some of the through holes 13. In the same manner as herebefore described, I compress particles of electro-conductive metal into the through holes 13, the mass 15 of which also extends into and makes electrical contact with the holes 22 of the embossed circuits 21, as shown in FIGS. 1 and 2. This mass of compressed metallic particles may be in the form of a cylinder 17, to receive a lead wire. Such cylinders obviously provide conductive through holes in the board. However, in many instances only conductive through fills will be desired, and in such cases the entire hole is filled by a particle compressed shaft 25 as shown in FIGS. 1 and 2.

The embossed circuit shown in FIG. 1 may be accomplished in any suitable manner. One method would be to take a circuit board as shown in FIG. 3, and which is a laminated board, comprising a plastic center sheet and a copper or like metallic sheet at each side thereof, and etching away certain portions of the metallic sheets to produce a circuit board similar to the one shown in FIG. 1.

Some change may be made in the construction and arrangement of my electric circuit board and method of fabricating same without departing from the real spirit and purpose of my invention, and it is my intention to cover by my claims, any modified forms of structure or use of mechanical equivalents which may be reasonably included within their scope.

I claim:

1. A circuit board comprising, in combination, a base sheet of electrically insulating material, at least one electrically conducting element on each side of said base sheet, means defining at least one hole extending through said base sheet and said electrically conducting element on each side thereof, and compressed particles of electrically conducting material in said hole providing electrical communication between said electrically conducting elements.

2. A circuit board comprising, in combination, a base sheet of electrically insulating material, circuits of electrically conducting material on each side of said base sheet, and compressed particles of electrically conducting material extending through selected portions of said base sheet to form an electrical contact between said circuits on opposite sides of said base sheet.

3. A circuit board comprising, in combination, a base sheet of electrically insulating material, electrically conducting elements affixed to opposite sides of said base sheets and having at least one hole extending through said conducting elements and said base sheet, and compressed particles of electrically conducting material in said hole to form an electrical contact between said electrically conducting elements on said opposite sides of said base sheet, said compressed particles being in the form of a cylinder having an opening extending therethrough.

4. A circuit board comprising, in combination, a base sheet of electrically insulating material, electrically conducting elements affixed to opposite sides of said base sheet, and at least one hollow cylinder of compressed particles of electrically conducting material extending through said base sheet and forming an electrical contact between said electrically conducting elements on said opposite sides of said base sheet.

No references cited.